(12) United States Patent
Ho

(10) Patent No.: US 6,848,040 B2
(45) Date of Patent: Jan. 25, 2005

(54) COLUMN ADDRESS PATH CIRCUIT AND METHOD FOR MEMORY DEVICES HAVING A BURST ACCESS MODE

(75) Inventor: Duc V. Ho, Allen, TX (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 10/414,818

(22) Filed: Apr. 15, 2003

(65) Prior Publication Data

US 2004/0013010 A1 Jan. 22, 2004

Related U.S. Application Data

(63) Continuation of application No. 09/802,384, filed on Mar. 9, 2001, now Pat. No. 6,557,090.

(51) Int. Cl.[7] ............................................. G06F 12/00
(52) U.S. Cl. ..................... 711/217; 711/218; 711/219; 711/220
(58) Field of Search ....................... 711/217–220, 104, 711/105, 147, 150, 154, 163, 167, 168; 710/35, 52, 58

(56) References Cited

U.S. PATENT DOCUMENTS

| | | | | |
|---|---|---|---|---|
| 4,451,880 A | * | 5/1984 | Johnson et al. | ............. 711/157 |
| 5,559,990 A | * | 9/1996 | Cheng et al. | ................ 711/157 |
| 5,751,987 A | * | 5/1998 | Mahant-Shetti et al. | ........ 711/5 |
| 5,784,331 A | * | 7/1998 | Lysinger | ................. 365/230.06 |
| 5,805,523 A | * | 9/1998 | Lysinger | ................. 365/230.08 |
| 5,892,777 A | * | 4/1999 | Nesheiwat et al. | .......... 714/718 |
| 5,907,857 A | * | 5/1999 | Biswas | ........................ 711/106 |
| 5,986,918 A | * | 11/1999 | Lee | .............................. 365/103 |
| 6,038,184 A | * | 3/2000 | Naritake | ...................... 365/221 |
| 6,285,622 B1 | * | 9/2001 | Haraguchi et al. | ........... 365/226 |
| 6,336,154 B1 | * | 1/2002 | McCarthy et al. | ............. 710/35 |

* cited by examiner

Primary Examiner—T Nguyen
(74) Attorney, Agent, or Firm—Dorsey & Whitney, LLP

(57) ABSTRACT

Column addresses are generated by a burst controller that includes respective latches for the three low-order bits of a column address. The two higher order bits of the latched address bits and their compliments are applied to respective first multiplexers along with respective bits from a burst counter. The first multiplexers apply the latched address bits and their compliments to respective second multiplexers during a first bit of a burst access, and bits from a burst counter during the remaining bits of the burst. The second multiplexers are operable responsive to a control signal to couple either the latched address bits or their compliments to respective outputs for use as an internal address. The control signal is generated by an adder logic circuit that receives the two low-order bits of the column address. The adder logic circuit processes the column address bits at the same time the address bits are being coupled through the second multiplexer to the first multiplexer as a function of the correct relationship between the internal address bits and the external address bits.

43 Claims, 7 Drawing Sheets

COLUMN ADDRESS PATH CIRCUIT AND METHOD FOR MEMORY DEVICES HAVING A BURST ACCESS MODE

CROSS-REFERENCE TO RELATED APPLICATION

This application is a continuation of U.S. patent application No. 09/802,384, filed Mar. 9, 2001, now U.S. Pat. No. 6,557,090 which is hereby incorporated by reference in its entirety.

TECHNICAL FIELD

This invention relates to memory devices capable of operating in a burst mode, and, more particularly, to a column address path for burst mode memory devices provide more optimum propagation of column addresses.

BACKGROUND OF THE INVENTION

Memory devices, including a synchronous dynamic random access memory Double Data Rate 10 shown in FIG. 1, typically receive both a row address and a column address that specify where data are to be transferred to or from within the memory device. The row and column addresses are initially applied to an address register 12 through an address bus 14. The address bus 14 is generally coupled to a memory controller (not shown in FIG. 1). Typically, a row address is initially received by the address register 12 and applied to a row address multiplexer 18. The row address multiplexer 18 couples the row address to a number of components associated with either of two memory banks 20, 22 depending upon the state of a bank address bit forming part of the row address. Associated with each of the memory banks 20, 22 is a respective row address latch 26 that stores the row address, and a row decoder 28 that applies various signals to its respective array 20 or 22 as a function of the stored row address. The row address multiplexer 18 also couples row addresses to the row address latches 26 for the purpose of refreshing the memory cells in the arrays 20, 22. The row addresses are generated for refresh purposes by a refresh counter 30 that is controlled by a refresh controller 32.

After the row address has been applied to the address register 12 and stored in one of the row address latches 26, a column address is applied to the address register 12. The address register 12 couples the column address to a column address latch 40. In a normal operating mode, the column address is coupled through a burst controller 42 directly to an address buffer 44. However, in a burst operating mode, the burst controller 42 generates a sequence of column addresses starting at the column address applied to the burst controller 42 from the column address latch 40. For example, the burst controller 42 may operate in a "burst 2" mode, in which one additional column address is generated by the burst controller 42, a "burst 4" mode, in which three additional column addresses are generated by the burst controller 42, and a "burst 8" mode, in which seven additional column addresses are generated by the burst controller 42. The burst controller 42 may also operate in either of two burst modes, namely a serial mode, in which the addresses generated by the burst controller 42 are sequential, or an interleaved mode, in which the addresses generated by the burst controller are sequential except that only the least significant bitt toggles between each pair of even and odd addresses. As discussed in greater detail below, it is important that column addresses generated by the burst controller 42 be quickly coupled to the column address buffer 44 after the burst controller 42 receives the initial column address from the column address latch 40.

After the burst controller 42 applies a column address to the column address buffer 44 in either the normal mode or the burst mode, the column address buffer 44 applies the column address to a column decoder 48. As is well known in the art, the column decoder 48 applies various signals to respective sense amplifiers and associated column circuitry 50, 52 for the respective arrays 20, 22.

Data to be read from one of the arrays 20, 22 is coupled to the column circuitry 50, 52 for the arrays 20, 22, respectively. The data are then coupled to a data output register 56, which applies the data to a data bus 58. Data to be written to one of the arrays 20, 22 are coupled from the data bus 58 through a data input register 60 to the column circuitry 50, 52 where they are transferred to the arrays 20, 22, respectively. A mask register 64 may be used to selectively alter the flow of data into and out of the column circuitry 50, 52, such as by selectively masking data to be read from the arrays 20, 22.

The above-described operation of the Double Data Rate 10 is controlled by a command decoder 68 responsive to high-level command signals received on a control bus 70. These high level command signals, which are typically generated by a memory controller (not shown in FIG. 1), are a clock enable signal CKE*, a chip select signal CS*, a write enable signal WE*, a row address strobe signal RAS*, and a column address strobe signal CAS*, which the "*" designating the signal as active low. The command decoder 68 generates a sequence of control signals responsive to the command signals to carry out the function (e.g., a read or a write) designated by the command signals. These control signals, and the manner in which they accomplish their respective functions, are conventional. Therefore, in the interest of brevity, a further explanation of these control signals will be omitted. The high-level command signals are clocked into the command decoder 68 in synchronism with a clock signal CLK. The CLK signal, or internal clock signals (not shown) generated from the CLK signal, control the timing at which the control signals carry out their respective functions in the SDRAM 10. The control signals are preferably registered with both the rising and falling edges of the CLK signal (or internal clock signals) so that two operations are accomplished each period of the CLK signal. An SDRAM 10 operating in this manner is known as a "Double Data Rate DRAM" because two bits of data are read from or written to the SDRAM 10 for each clock CLK pulse.

One conventional design for a portion of the burst controller 42 is illustrated in FIG. 2. The burst controller 42' may include substantially more circuitry than is shown in FIG. 2, but this circuitry has been omitted in the interest of brevity because this additional circuitry is not particularly relevant to the problem that the disclosed invention is intended to solve. The signals XA0–XA9 are the external column address signals coupled to the SDRAM 10 through the address bus 14 (FIG. 1) and then through the address register 12 to the column address latch 40. As previously mentioned, the burst controller 42' then outputs column address designated as IA0–IA9 to the column address buffer 44. In the burst mode, bits IA0 and IA3–IA9 of the internal column address are generated differently from the remaining bits IA1 and IA2 of the internal column address. More specifically, the IA0 and IA3–IA9 bits are generated by coupling the external bits A0 and A3–A9 from respective column address latches 40 through a respective column address path 90. The reason these bits are generated differently is that the maximum size of the burst is 8 bits, and 8 bits can be counted using three bits of the internal address, i.e., IA2, IA1 and IA0. The bits IA3–IA9 of the internal column address are constant as the IA2–IA0 bits are incremented by a count of either 2, 4 or 8, depending upon the length of the burst. The IA0 bit selects whether an even or an odd-numbered column will be initially addressed, and it toggles with each edge of the CLK signal, assuming the SDRAM 10 is a double data rate SDRAM.

As mentioned above, in the burst mode, the IA2 and IA1 bits are incremented from their initial values. This incrementing is accomplished for the first bit of the burst by adder logic circuits 100 and 102. The adder logic circuit 100 receives a latched external address bits LA_S0 and LA_S1 from respective column address latches 40. The adder logic circuit 102 receives latched external address bits LA_S0, LA_S1 and LA_S2 from respective column address latches 40. The adder logic circuits 100, 102 then output respective address bits A1_INC and A2_INC, which are applied to an input of a respective multiplexer 110, 112. The other input of each multiplexer receives a respective set of bits from a burst counter 116. The burst counter 116 supplies the bits CNT1_INC and CNT2_INC for all column addresses of a burst after the first bit of the burst. Each multiplexer 110, 112 is controlled by a RDWRA signal that has a first logic level during the first bit of a burst and has a second logic level during the remaining bits of the burst. The multiplexers 110, 112 thus couple the input of respective drivers 120, 122 to the outputs of respective adder logic circuits 100, 102 during the first bit of a burst, and then to the burst counter 116 during the remaining bits of the burst. The drivers 120, 122, as well as a set of drivers 128 coupled to the outputs of the column address path 90, output the resulting bits IA0–IA9 to the column decoder 48 (FIG. 1).

As previously mentioned, the columns in the memory banks 20, 22 are divided into even-numbered and odd-numbered columns. As will be explained further below, the IA2 and IA1 bits of each column address for the odd-numbered columns (in which the IA0 bit is a "1") in the first bit of each burst are generated directly from the XA2 and XA1 bits so that IA2=XA2 and IA1=XA1. The IA2 and IA1 bits of each column addresses for the even-numbered columns (in which the IA0 bit is a "0") in the first bit of each burst are generated by the adder logic circuits 100, 102.

Several examples of the low-order bits IA2, IA1 of the internal address generated from the low-order bits XA2, XA1, XA0 of the external address for several different burst operating modes will now be provided. The first example shows the internal addresses generated for a burst of 8 starting with address "010" in a serial column access. The low-order bits of the external address and the IA2 and IA1 bits of the internal address bits are as follows:

| External Addresses | XA2 | XA1 | XA0 | |
|---|---|---|---|---|
| | 0 | 1 | 0 | |
| Internal Addresses | IA2 | IA1 | | |
| First bit of burst | 0 | 1 | 0 | Even |
| | 0 | 1 | 1 | Odd |
| Second bit of burst | 1 | 0 | 0 | Even |
| | 1 | 0 | 1 | Odd |
| Third bit of burst | 1 | 1 | 0 | Even |
| | 1 | 1 | 1 | Odd |
| Last bit of burst | 0 | 0 | 0 | Even |
| | 0 | 0 | 1 | Odd |

In this case, since the low-order bit XA0 is "0", the internal address bits IA2 and IA1 for both the even-numbered column and the odd-numbered column are the same as respective external address bits XA2 and XA1. For the first bit of the burst, the internal address bits IA2 and IA1 for the even-numbered column are generated by the adder logic circuits 100, 102, and the internal address bits IA2 and IA1 for the odd-numbered column are generated directly from the external address bits XA2 and XA1, respectively. For the second through last bits of the burst, the internal address bits IA2 and IA1 for both the even-numbered columns are generated by the burst counter 116.

In a second example, a burst of 8 in a serial column access occurs starting with address "011". The IA2 and IA1 bits of the internal address bits are as follows:

| External Addresses | XA2 | XA1 | XA0 | |
|---|---|---|---|---|
| | 0 | 1 | 1 | |
| Internal Addresses | IA2 | IA1 | | |
| First bit of burst | 0 | 1 | 1 | Odd |
| | 1 | 0 | 0 | Even |
| Second bit of burst | 1 | 0 | 1 | Odd |
| | 1 | 1 | 0 | Even |
| Third bit of burst | 1 | 1 | 1 | Odd |
| | 0 | 0 | 0 | Even |
| Last bit of burst | 0 | 0 | 1 | Odd |
| | 0 | 1 | 0 | Even |

In this case, since the low-order bit XA0 is "1" and the burst mode is for a serial address with a burst of 8, the internal address bits IA2 and IA1 for the even-numbered column are the complement of the respective external address bits XA2 and XA1.

The third example is for serial access with a burst length of 4, starting at address "010".

| External Addresses | XA2 | XA1 | XA0 | |
|---|---|---|---|---|
| | 0 | 1 | 0 | |
| Internal Addresses | IA2 | IA1 | | |
| First bit of burst | 0 | 1 | 0 | Even |
| | 0 | 1 | 1 | Odd |
| Last bit of burst | 0 | 0 | 0 | Even |
| | 0 | 0 | 1 | Odd |

In this case, IA2 does not change since, for a burst length of 4, only IA1 must change to count to 4. Since XA0 is "0", IA0 for the even-numbered column address is equal to XA0.

The fourth example is also for a serial access with a burst length of 4, but this time the initial column address is "011".

| External Addresses | XA2 | XA1 | XA0 | |
|---|---|---|---|---|
| | 0 | 1 | 1 | |
| Internal Addresses | IA2 | IA1 | | |
| First bit of burst | 0 | 1 | 1 | Odd |
| | 0 | 0 | 0 | Even |
| Last bit of burst | 0 | 0 | 1 | Odd |
| | 0 | 1 | 0 | Even |

Again, since a burst length of 4 only requires that the address be increment by 4, IA2 does not change. However, since XA0 is equal to "1", IA1 for the even-numbered column address is equal to the complement of XA1.

In a fifth example, a burst length of 2 occurs with a serial access and a starting address of "010".

| External Addresses | XA2 | XA1 | XA0 | |
|---|---|---|---|---|
| | 0 | 1 | 0 | |
| Internal Addresses | IA2 | IA1 | | |
| First bit of burst | 0 | 1 | 0 | Even |
| | 0 | 1 | 1 | Odd |

In this case, neither IA2 nor IA1 change since, for a count of 2, only IA0 must change. Since XA0 is "0", IA0 for the even-numbered column address is equal to XA0.

A sixth example also uses a burst length of 2 with a serial access, but this time the starting address is "011".

| External Addresses | XA2 | XA1 | XA0 | |
|---|---|---|---|---|
| | 0 | 1 | 1 | |
| Internal Addresses | IA2 | IA1 | | |
| First bit of burst | 0 | 1 | 1 | Odd |
| | 0 | 1 | 0 | Even |

Again, neither IA2 nor IA1 change since, for a count of 2, only IA0 must change. But since XA0 is "1", IA0 for the even-numbered column address is equal to the complement of XA0.

In a seventh example, an interleaved access occurs with a burst length of 8, starting at a column address "010".

| External Addresses | XA2 | XA1 | XA0 | |
|---|---|---|---|---|
| | 0 | 1 | 0 | |
| Internal Addresses | IA2 | IA1 | | |
| First bit of burst | 0 | 1 | 0 | Even |
| | 0 | 1 | 1 | Odd |
| Second bit of burst | 1 | 0 | 0 | Even |
| | 1 | 0 | 1 | Odd |
| Third bit of burst | 1 | 1 | 0 | Even |
| | 1 | 1 | 1 | Odd |
| Last bit of burst | 0 | 0 | 0 | Even |
| | 0 | 0 | 1 | Odd |

In this case, the internal address bits IA2 and IA1 for both the even-numbered column and the odd-numbered column are the same as respective external address bits XA2 and XA1. Thus, for a burst length of 8 when XA0 is "0", IA2 and IA1 have the same relationship to XA2 and XA1, respectively, in both the serial access mode and the interleaved access mode.

A final example is for an interleaved access with a burst length of 8 and a starting column address of "011".

| External Addresses | XA2 | XA1 | XA0 | |
|---|---|---|---|---|
| | 0 | 1 | 1 | |
| Internal Addresses | IA2 | IA1 | | |
| First bit of burst | 0 | 1 | 1 | Odd |
| | 0 | 1 | 0 | Even |
| Second bit of burst | 1 | 0 | 1 | Odd |
| | 1 | 0 | 0 | Even |
| Third bit of burst | 1 | 1 | 1 | Odd |
| | 1 | 1 | 0 | Even |
| Last bit of burst | 0 | 0 | 1 | Odd |
| | 0 | 0 | 0 | Even |

In this case, the internal address bits IA2 and IA1 for the even-numbered column are the same as respective external address bits XA2 and XA1. Thus, for a burst length of 8 when XA0 is "1", IA2 and IA1 have the opposite relationship to XA2 and XA1, respectively, in the interleaved access mode than they have in the serial access mode, as will be apparent by comparing this example to example 1.

Based on the foregoing, and other examples that can be given, it can be seen that IA2 and IA1 for the even column addresses are the following functions of XA2, XA1 and XA0 ("*" denotes an "and" function and "+" denotes an "or" function):

for IA1

$IA1=XA1$ for $XA0=$"0"+Burst2+Interleave $IA1=XA1^*$ for $XA0=$"1"*Burst8 or 4*Serial for IA2

$IA2=XA2$ for $XA0=$"0"+$XA1=$"0"+Burst2 or 4+Interleave $IA2=XA2^*$ for $XA0=$"1"* $XA1=$"1"* and Burst8*Serial As explained below, the adder logic circuits 100, 102 implement the above equations to determine the IA1 and IA2 bits of the column address for the even-numbered columns for the first bit of each burst.

The burst controller 42' is shown in greater detail in FIG. 3. The adder logic circuit 100 for the XA1 bit receives the latched address bits signal LA_S0 and LA_S1 from respective column address latches 40, as previously explained. The LA_S1 signal is coupled through an inverter 140 to one input of a multiplexer 142 while a second input of the multiplexer 142 receives its complement through an inverter 146. The multiplexer 142 outputs a signal to an inverter 146 that corresponds to either the XA1 bit or its complement depending upon the state of a signal applied to the CLK input of the multiplexer 142. The CLK input of the multiplexer 142 is driven by a NOR-gate 150, which receives the complement of the latched LA_S0 signal from an inverter 152. If the output of the NOR-gate 150 is low, the multiplexer 142 couples the output of the inverter 140 to the input of the inverter 146. The output of the NOR-gate 150 will be low whenever the complement of the LA_S0 signal is high, which will occur whenever the external address input XA0 is low. The output of the NOR-gate 150 will also be low whenever a BURST2 input is high, which occurs in the burst 2 mode. Finally, a LINTL signal will be high whenever the burst controller 42' is operating in the interleaved mode. Thus, the NOR-gate 150 and the inverter 152 cause the multiplexer 142 to output the complement of the LA_S1 signal in the either the burst 2 mode, when the latched external input LA_S0 is low or in the interleaved mode. The LA_S1 signal is inverted twice, once by the inverter 140 and once by the inverter 146 as it is coupled through the multiplexer 142 to the output as signal A1_INC. The A1_INC signal will thus be equal to the LA_S1 signal in either the burst 2 or interleaved modes, or when the external address bit XA0 is low. In all other situations, i.e. in the either the burst 4 or burst 8 modes and when the external address bit XA0 is low, the multiplexer 142 outputs the LA_S1 signal, thus making the A1_INC signal equal to the complement of the LA_S1 signal.

The adder logic circuit 102 for the IA2 bit operates in a manner similar to the operation of the adder logic circuit 100. Specifically, the latched external address bit LA_S2 is applied to one input of a multiplexer 162 through two inverters 160, 164, and the complement of the LA_S2 bit is applied to another input of the multiplexer 162 through the inverter 160. A NOR-gate 170 is coupled to the CLK input of the multiplexer 162, and input so the NOR-gate 170 are coupled to outputs from a NAND-gate 172 and inverter 174.

The NOR-gate 170, NAND-gate 172 and inverter 174 decode the latched LA_S0 and LA_S1 bits, a burst 8 signal indicative of operation in the burst 8 mode and the LINTL signal indicative of operation in the interleaved mode. The signals are decoded so that the multiplexer 162 couples the output of the inverter 160 to an inverter 178, thus making the A2_INC signal equal to the LA_S2 bit when the burst controller 42' is operating in either the burst 8 or at the interleaved mode or when the external address bit XA0 is 0. When the burst controller 42' is operating in the burst 8 mode and the serial mode, and when the XA0 and XA1 bits are both 1, the multiplexer 162 couples the output of the inverter 164 to its output, thus making the A2_INC signal equal to the complement of the LA_S2 bit.

The output of the adder logic circuit 100 is applied to one input of the multiplexer 110. The other input of the multiplexer 110 receives a CNT1_INC signal from the burst counter 116 (FIG. 2), as previously explained. During the first bit of a burst, the RDWRA signal is high to cause the multiplexer 110 to couple the A1_INC input to the output, thus making the internal address bit IA1 for the even column equal to the A1_INC signal. For subsequent bits of the burst, the RDWRA signal is low to cause the multiplexer 110 to couple the CNT1_INC input to the output, thus making the internal address bit IA1 for the even column equal to the CNT1_INC signal. The output of the adder logic circuit 102 is coupled through the multiplexer 112 in essentially the same manner.

In summary, the above-described circuitry of the burst controller 42' functions to make the internal address bit IA1 equal to the external address bit XA1 when the burst controller 42' is operating in the burst 2 mode or the interleaved mode or when the external address bit XA0 is "0". The internal address bit IA1 is equal to the complement of the external address bit XA1 when the burst controller 42' is operating in the interleaved mode and in either the burst 4 or 8 mode and the external address bit XA0 is "1". Similarly, the above-described circuitry functions to make the IA2 bit equal to the external address bit XA2 when the burst controller 42' is operating in the burst 2 or burst 4 mode or the interleaved mode or when the XA0 bit is "0" or the XA1 bit is "0". The internal address bit IA2 is equal to the complement of the external address bit XA2 when the burst controller 42' is operating in the serial mode and in the burst 8 mode and the external address bits XA0 and XA1 are both "1".

The major disadvantage of the circuitry used in the burst controller 42' of FIGS. 2 and 3 stems from the number of circuit components the external address bits must be coupled through to generate the internal address bits. Specifically, from the address latch 40, the LA_S0 signal for the even columns is coupled through the inverter 152, the NOR-gate 150, the multiplexer 142, the inverter 146, and the multiplexer 110. In contrast, the LA_S0 signal for the odd columns is coupled through only a multiplexer 170. A similar disparity exists between the LA_S1 signal for the odd columns and the LA_S1 signal for the even columns. As a result, the internal address bits IA1 and IA2 for the even columns reach the column decoder 44 (FIG. 1) substantially later than the internal address bits IA1 and IA2 for the odd columns. In addition to this lack of symmetry, the inherent delay in passing the latched address bits LA_S0 and LA_S1 through 5 circuit components unduly delays the time that the column decoder 44 can begin decoding a column address.

As the speed at which memory devices continues to increase, these delays in decoding, addresses can markedly slow the operating speed of memory devices. There is therefore need for a burst controller that is capable of outputting internal addresses with less delay than the prior art burst controller described above.

SUMMARY OF THE INVENTION

A burst controller adapted for use in a memory device couples a bit of the external address and its complement to a first multiplexer through a first signal path. The external address bit is also applied to a logic circuit through a second signal path that is different from the first signal path. While the external address bit and its complement are being coupled through the first signal path, the logic circuit processes the external address bit to determine the relationship between the internal column address bit and the external column address bit. The logic circuit then generates a control signal corresponding to the determined relationship. The control circuit is applied to the multiplexer to cause the multiplexer to select either the bit of the external address or its complement as the internal address bit the multiplexer makes this selection based on the control signal. The external address bit and its complement may be coupled to the first multiplexer through a second multiplexer that may also receive a bit from a burst counter. The second multiplexer couples the external address bit and its complement to the first multiplexer during the first bit of a burst, and the bit from the burst counter to the first multiplexer during the remaining bits of the burst.

DETAILED DESCRIPTION OF THE INVENTION

Figure 4:
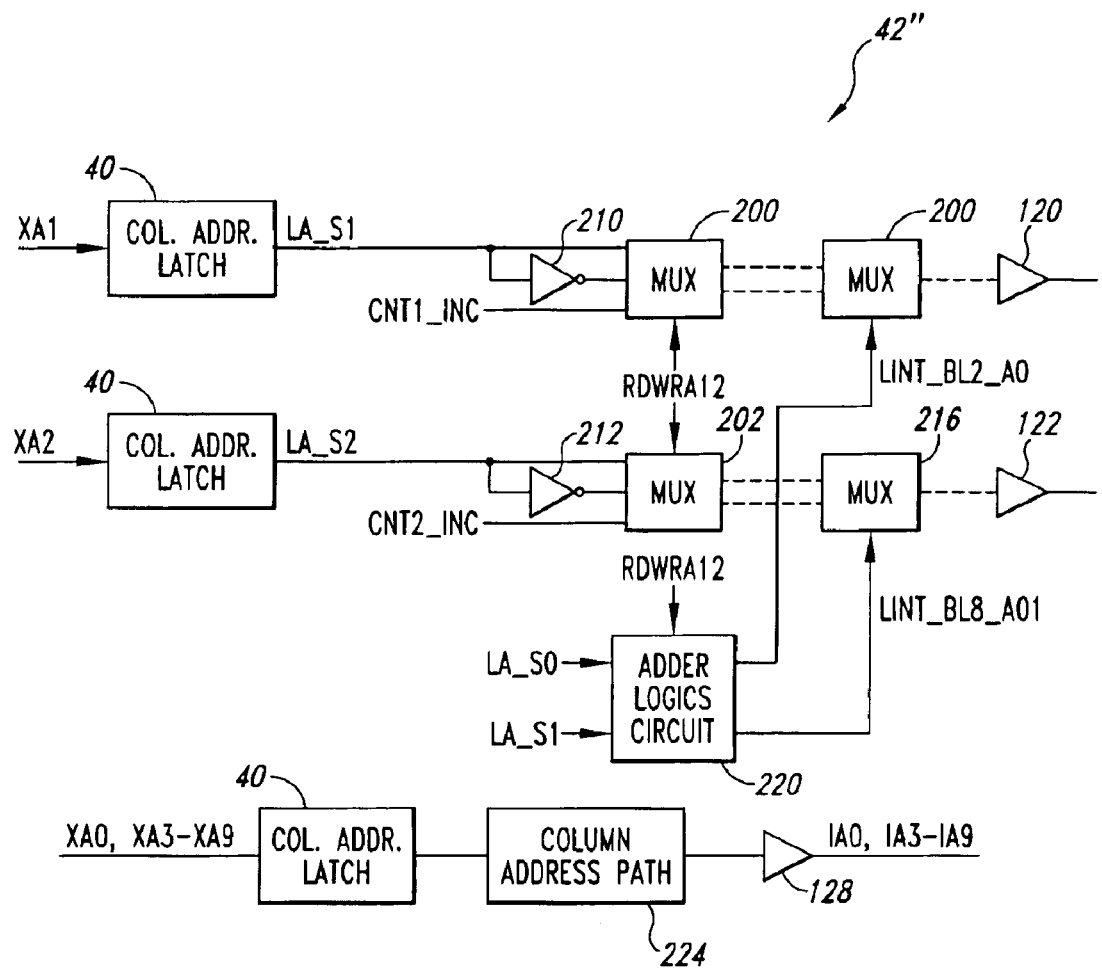
FIG. 4 is a block diagram of a portion of a portion of a burst controller according to one embodiment of the invention.

A burst controller 42" according to one embodiment of the invention is shown in FIG. 4. In the burst controller 42", the latched address bits LA_S1 and LA_S2 are applied directly to respective multiplexers 200, 202, directly and through respective inverters 210, 212. The multiplexers 200, 202 also receive the CNT1_INC and CNT2_INC signals from the burst counter 116, as explained above. The multiplexers 200, 202 are controlled by a RDWRA 12 signal, which is high during the first bit of the burst. The multiplexers 200, 202 then couple the latched address bits LA_S1 and LA_S2 to one output of the multiplexers 200, 202, respectively, and their complements to a second output of the multiplexers 200, 202. Both of these outputs are applied to the inputs of a second pair of inverters 214, 216.

By coupling the latched address bits LA_S1 and LA_S2 directly to the multiplexers 200, 202 rather than coupling them through logic address circuits, the latched address bits LA_S1 and LA_S2 are not delayed before reaching the multiplexers 200, 202, as in the conventional burst controller 42'. Instead, the burst controller 42" includes an adder logic circuit 220 that determines the correct relationship of the internal address bits IA1 and IA2 relative to the external address bits XA1 and XA2, respectively, and causes the multiplexers 214, 216 to select the proper outputs of the multiplexers 200, 202 accordingly. Significantly, the adder logic circuit 220 performs its function in parallel and at the same time the LA_S1 and LA_S2 bits are being coupled through the multiplexers 200, 202 to the multiplexers 214, 216, respectively. As a result, the burst controller 42" is able to generate the internal address bits IA1 and IA2 significantly faster than the conventional burst controller 42'. Also shown in FIG. 4 is a column address path 224 for the IA3-IA9 address bits.

Figure 5:
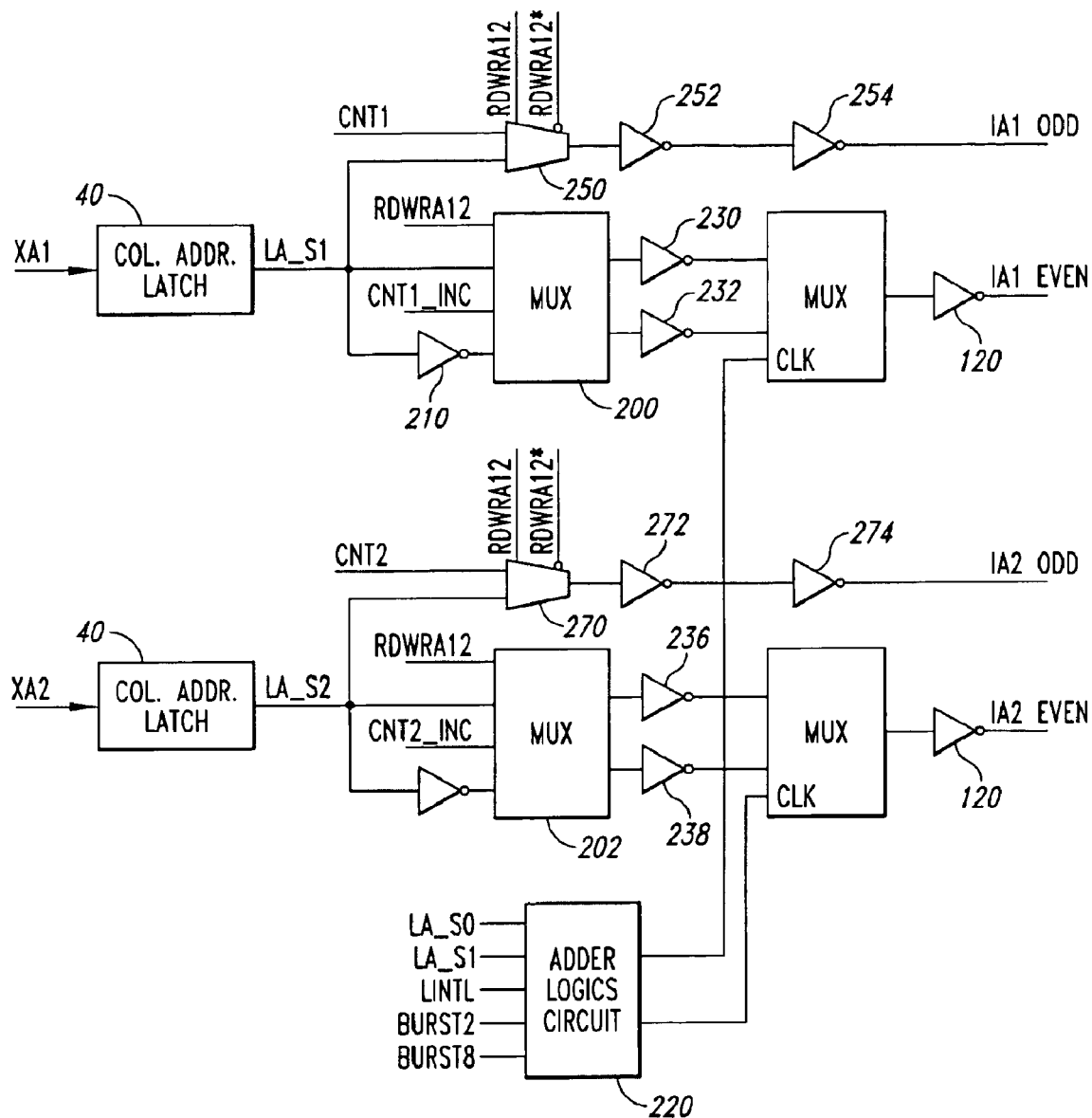
FIG. 5 is a logic diagram showing the burst controller of FIG. 4 in greater detail.

The burst controller 42" is shown in greater detail in FIG. 5, in which identical components have been provided the same reference numeral. The burst controller 42" is as shown in FIG. 4 except that the outputs of the multiplexer 200 are coupled to the multiplexer 214 through a pair of inverters 230, 232, and the outputs of the multiplexer 202 are similarly coupled to the multiplexer 216 through a pair of inverters 236, 238. Also, each of the drivers 120 are shown as being formed by a pair of serially coupled inverters 240, 242.

As also shown in FIG. 5, the LA_S1 bit is coupled through a multiplexer 250 and 2 series connected inverters 252, 254 to provide the internal address bit IA1 for the odd-numbered columns. Similarly, the LA_S2 bit is coupled through a multiplexer 270 and 2 series connected inverters 272, 274 to provide the internal address bit IA2 for the odd-numbered columns.

Figure 6:
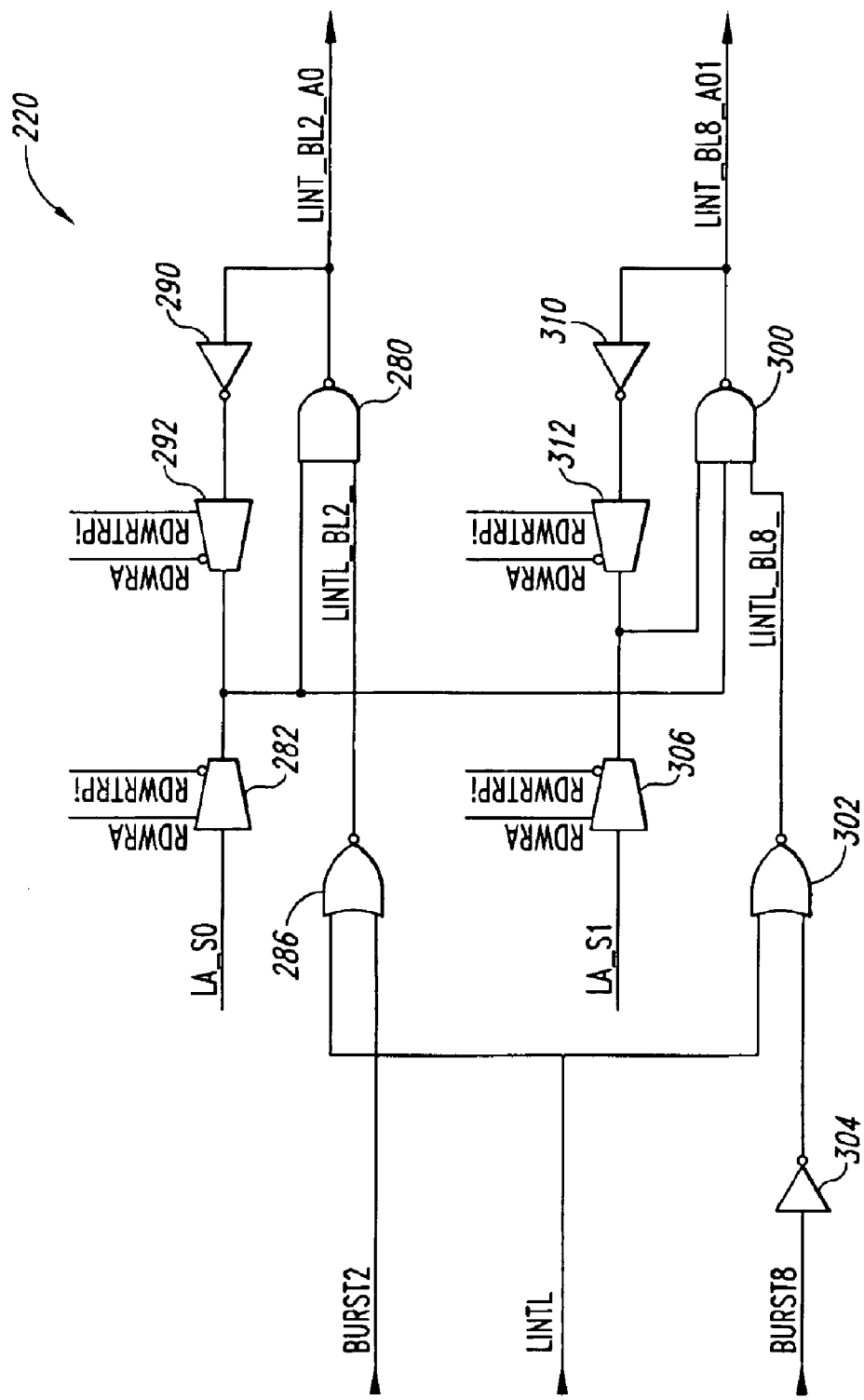
FIG. 6 is a logic diagram showing an embodiment of a adder logic circuit used in the burst controller of FIG. 4.

The adder logic circuit 220 shown in FIG. 5 is shown in greater detail in FIG. 6. The adder logic circuit 220 includes a NAND-gate 280 that receives the LA_S0 bit through a multiplexer 282, which is switched to its conductive state during the first bit of a burst. Another input of a NAND-gate receives the output of a NOR-gate 286. The output of the NAND gate 280 is latched by coupling its output to an input though an inverter 290 and a pass gate 292. The NOR-gate 286 decodes a BURST2 signal, which is high when the burst controller 42" is operating in the burst 2 mode, and the LINTL signal, which is high when the burst controller 42" is operating in the interleaved mode. The NAND gate 280 generates a high LINT_BL2_A0 signal whenever the LA_S0 signal is low or the BURST2 signal is high indicative of operation in the Burst 2 mode or the LINTL signal is high indicative of operation in the interleaved mode. A high LINT_BL2_A0 signal causes the multiplexer 214 to select the proper input from the multiplexer 200 so that the IA1 bit is equal to XA1 in accordance with the equations provided above. The NAND gate 280 generates a low LINT_BL2_A0 signal whenever the LA_S0 signal is high and the BURST2 signal is low indicative of operation in the Burst 4 or Burst 8 mode and the LINTL signal is low indicative of operation in the serial mode. A low LINT_BL2_A0 signal causes the multiplexer 214 to select the proper input from the multiplexer 200 so that IA1 is equal to the complement of XA1 in accordance with the equations provided above.

In operation, the pass gate 282 is switched closed by a high RDWRA signal and a low RDWRTRPi signal during the first bit of the burst. The RDWRA signal then transitions low and the RDWRTRPi signal transitions high during the remaining bits of the burst to open the pass gate 282 and close the pass gate 292, thereby latching the output of the NAND gate 280 for the remainder of the burst.

A NAND gate 300, a NOR gate 302, an inverter 304 and a pass gate 306 similarly decode the LA_S0 bit, the LA_S1 bit, a BURST8 signal indicative of a burst length of 8, and the LINTL signal indicative of operation in the interleaved mode. Also, an inverter 310 and pass gate 312 latch the output of the NAND gate 300 in the same manner as the inverter 290 and pass gate 292, as described above. The NAND gate 300 generates a high LINT_BL2_A1 signal whenever the LA_S0 signal is low or the LA_S1 signal is low or the BURST8 signal is high indicative of operation in the Burst 2 mode or the Burst 4 mode, or the LINTL signal is high indicative of operation in the interleaved mode. A high LINT_BL2_A1 signal causes the multiplexer 214 to select the proper input from the multiplexer 200 so that IA2 bit is equal to XA2 in accordance with the equations provided above. The NAND gate 300 generates a low LINT_BL2_A1 signal whenever the LA_S0 signal is high and the LA_S1 signal is high and the BURST8 signal is high indicative of operation in the Burst 8 mode and the LINTL signal is low indicative of operation in the serial mode. A low LINT_BL2_A1 signal causes the multiplexer 216 to select the proper input from the multiplexer 202 so that the IA2 bit is equal to the complement of XA2 in accordance with the equations provided above.

The burst controller 42" is able to provide performance that is superior to the performance of the prior art burst controller 42' because of the basic differences in the manner in which the latched address signals are coupled through the respective burst controllers. In the prior art burst controller 42', the adder logic circuits 100, 102 determine the correct relationship between the external address signals and the internal address signals (i.e., either the same as the internal address signals or the complement of the internal address signals) and then apply the correct internal address signals to the multiplexers 110, 112, respectively. The multiplexers 110, 112 then select either the address bits from the adder logic circuits 100, 102 or the address bits from the burst counter 116, thereby resulting in further delays. In contrast, in the burst controller 42" according to one embodiment of the invention, the multiplexers 200, 202 select either the latched external address bits and their complements or the address bits from the burst counter 116, and then apply the selected address bits to the final multiplexers 214, 216. At the same time this process is occurring, the adder logic circuit 220 is determining the correct relationship between the external address bits and the internal address bits (i.e., either the same as the internal address signals or the complement of the internal address signals). The adder logic circuit 220 then causes the multiplexers 214, 216 to select the correct external address signal. Since the latched address bits LA_S1 and LA_S2 are coupled to the multiplexers 214, 216, respectively, in parallel and at the same time as the adder logic circuit 220 processes the latched address bits LA_S0 and LA_S1, there is relatively little delay in generating the internal address bits IA1 and IA2. Furthermore, the internal address bits IA1 and IA2 for the even-numbered columns are generated with only one additional circuit component delay than generation of the internal address bits IA1 and IA2 for the odd-numbered columns.

Figure 1:
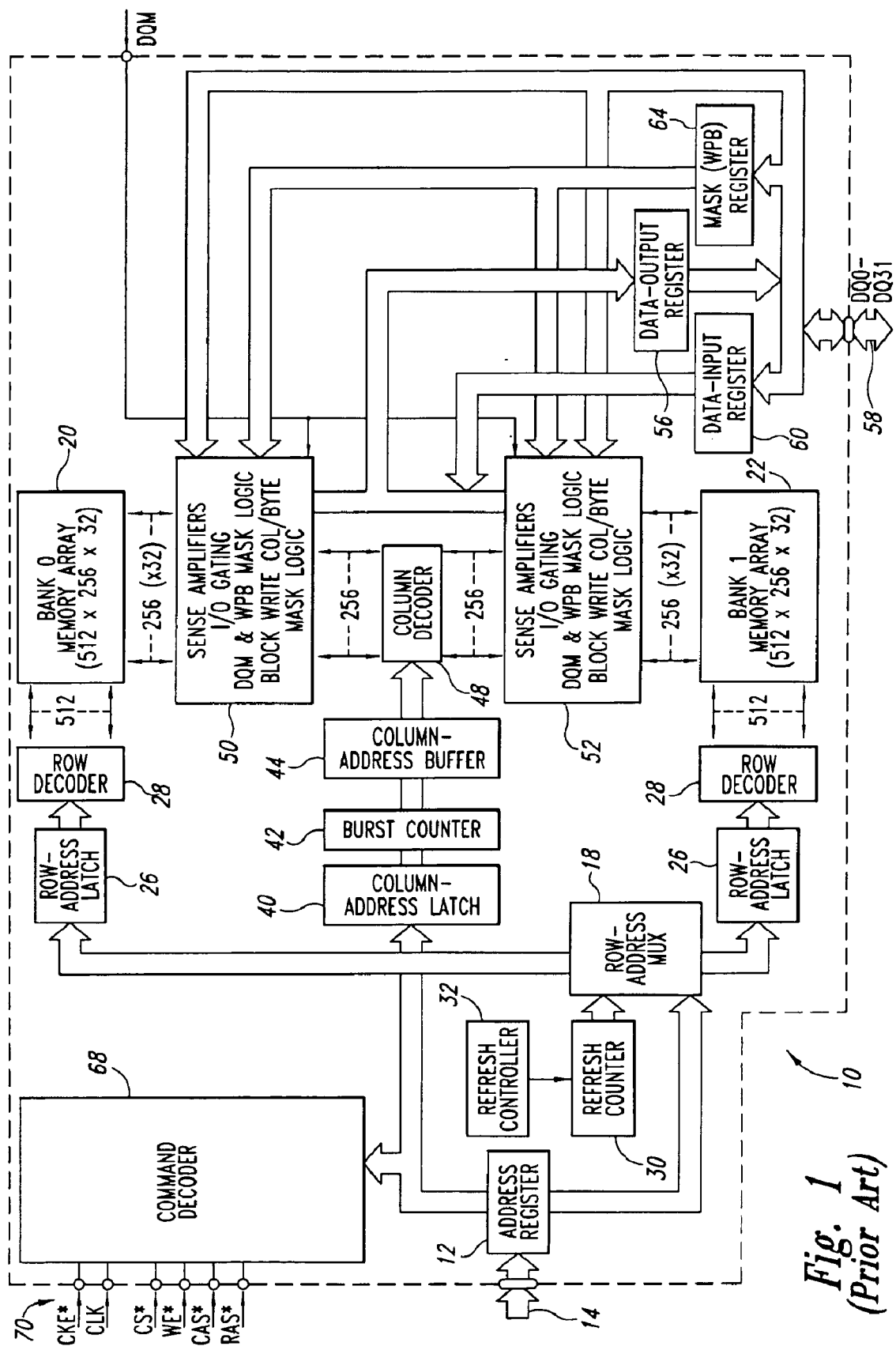
FIG. 1 is a block diagram of a conventional memory device that may use either a conventional burst controller or an embodiment of a burst controller in accordance with the present invention.
Figure 2:
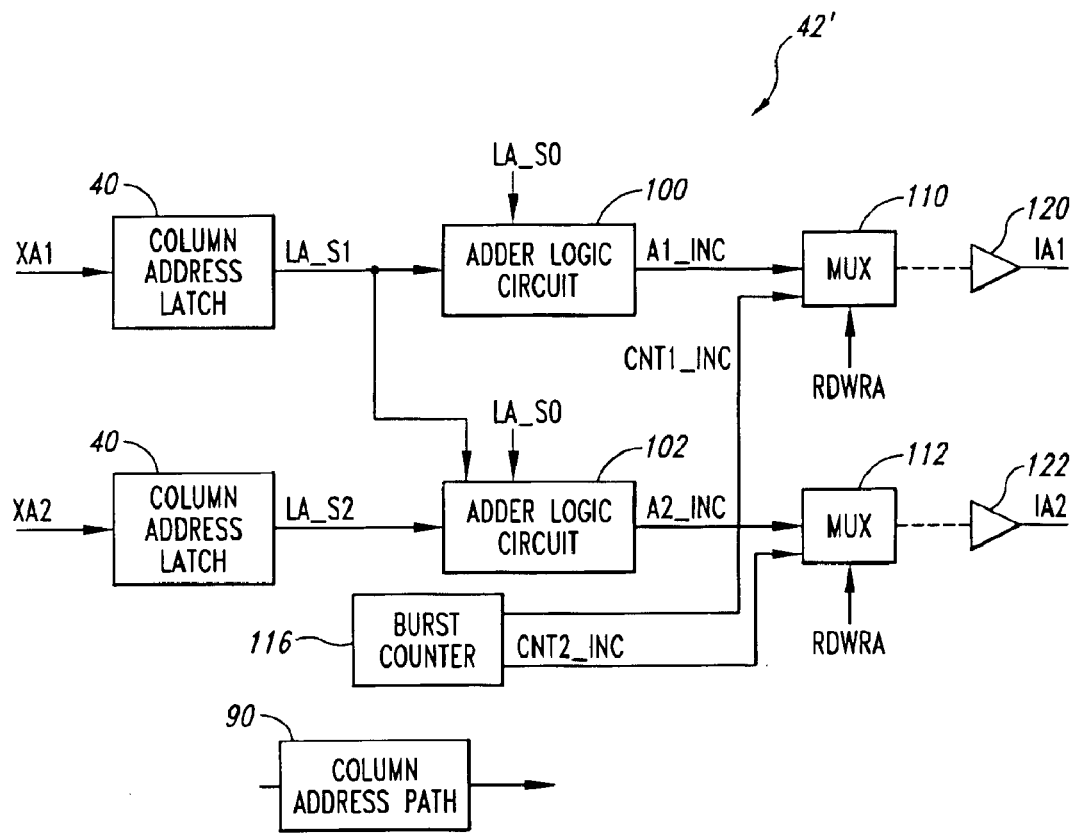
FIG. 2 is a block diagram of a portion of a conventional burst controller.
Figure 3:
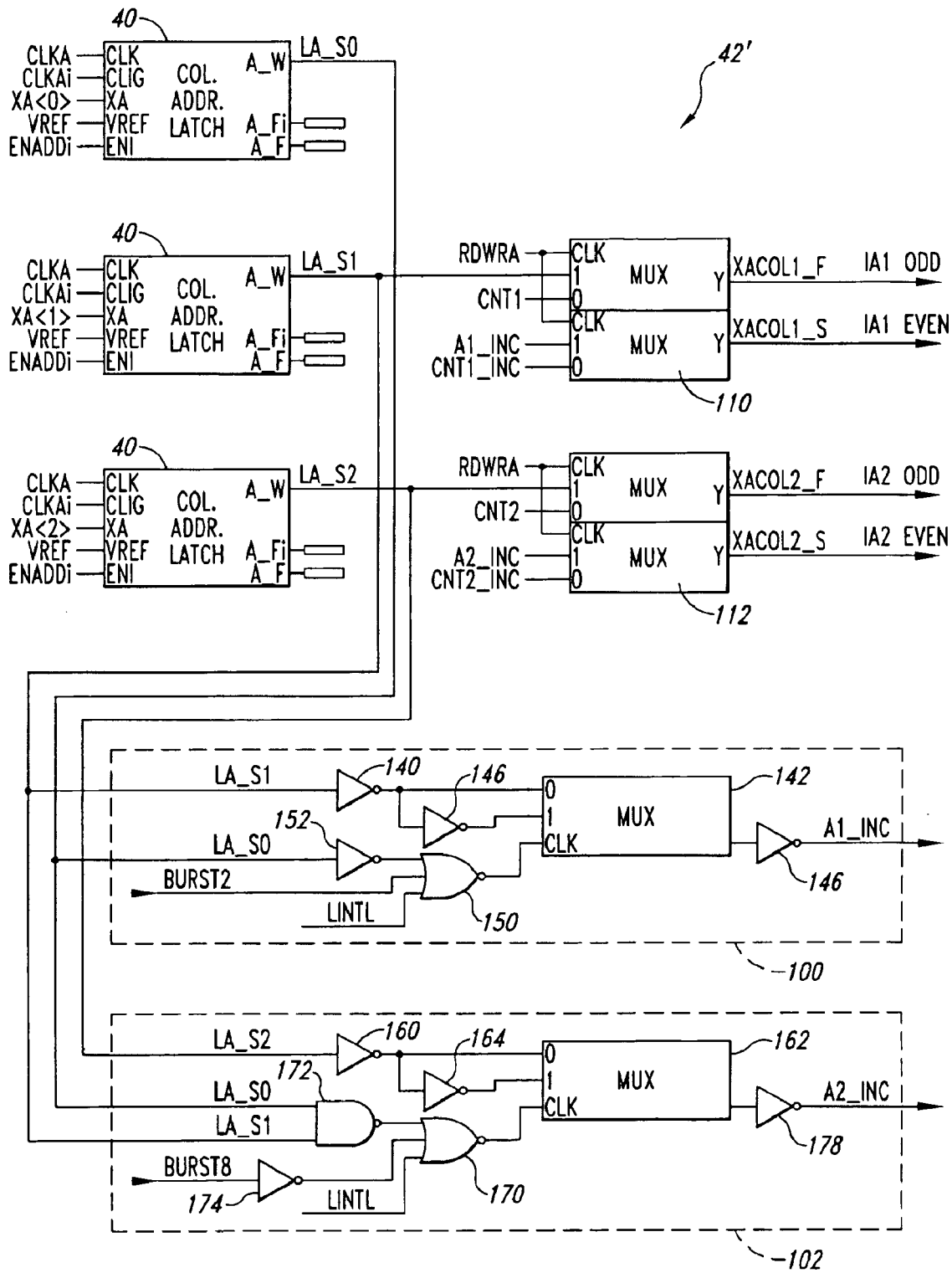
FIG. 3 is a logic diagram showing the burst controller of FIG. 2 in greater detail.
Figure 7:
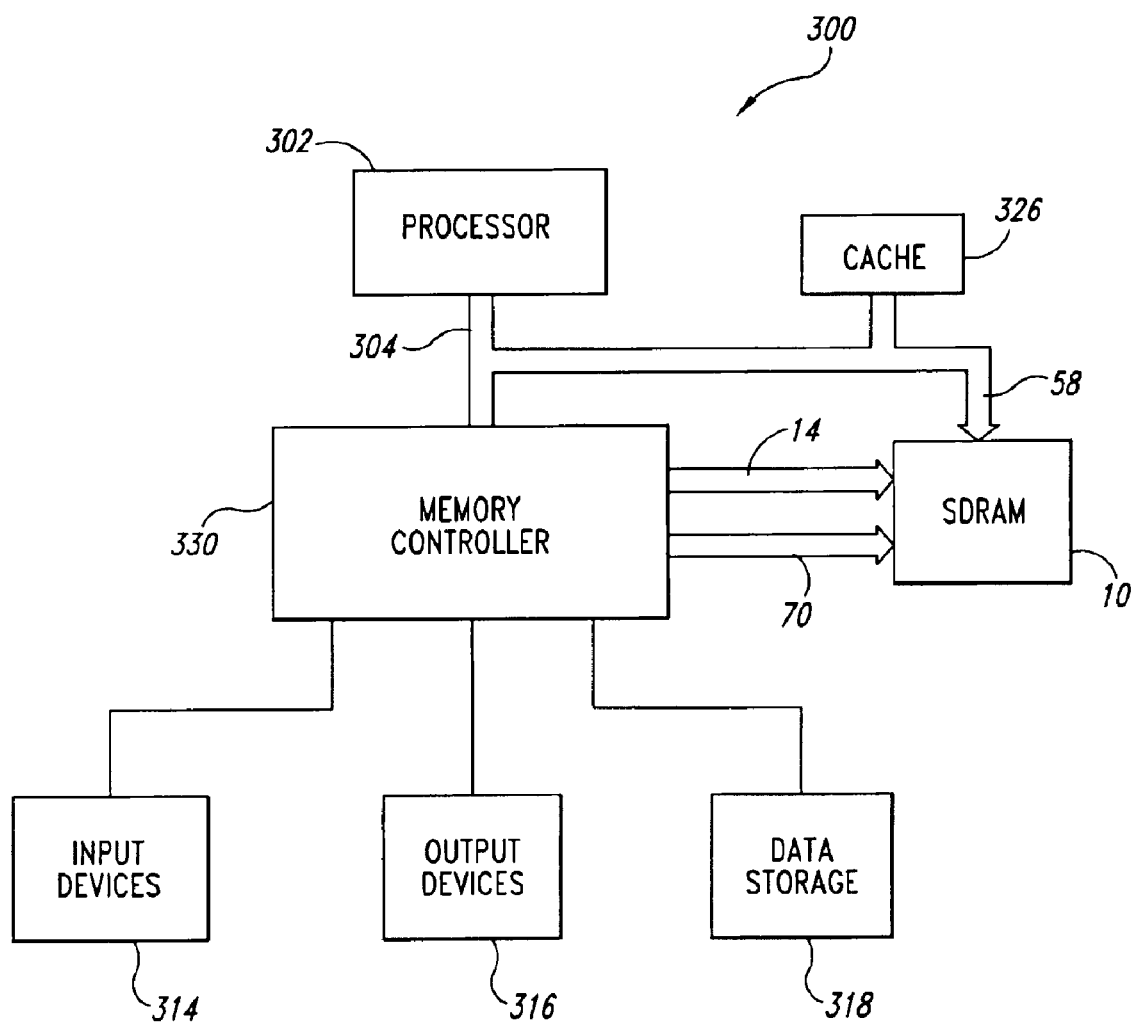
FIG. 7 is a block diagram of a computer system using the memory device of FIG. 1 containing the burst controller of FIG. 4.

FIG. 7 is a block diagram of a computer system 300 that includes the SDRAM 10 of FIG. 1, including the column address burst controller of FIG. 4. The computer system 300 includes a processor 302 for performing various computing functions, such as executing specific software to perform specific calculations or tasks. The processor 302 includes a processor bus 304 that normally includes an address bus, a control bus, and a data bus. In addition, the computer system 300 includes one or more input devices 314, such as a keyboard or a mouse, coupled to the processor 302 to allow an operator to interface with the computer system 300. Typically, the computer system 300 also includes one or more output devices 316 coupled to the processor 302, such output devices typically being a printer or a video terminal. One or more data storage devices 318 are also typically coupled to the processor 302 to allow the processor to store data or retrieve data from internal or external storage media (not shown). Examples of typical storage devices 318 include hard and floppy disks, tape cassettes, and compact disk read-only memories (CD-ROMs). The processor 302 is also typically coupled to cache memory 326, which is usually static random access memory ("SRAM") and to the SDRAM 10 through a memory controller 330. The memory controller 330 normally includes the control bus 70 and the address bus 14 that is coupled to the SDRAM 10. The data bus 58 may be coupled to the processor bus 304 either directly (as shown), through the memory controller 330, or by some other means.

From the foregoing it will be appreciated that, although specific embodiments of the invention have been described herein for purposes of illustration, various modifications may be made without deviating from the spirit and scope of the invention. For example, although the burst controller is explained as being used in an SDRAM, it will be understood that it may be advantageously used in other types of memory devices. Accordingly, the invention is not limited except as by the appended claims.

What is claimed is:

1. A system for generating an internal address bit, comprising:
   an inverter circuit receiving first external address bit and generating the complement of the first external address bit;
   a selection circuit coupled to the inverter circuit, the selection circuit receiving the first external address bit and the complement of the first external address bit, the selection circuit coupling one of the first external address bit and the complement of the first external address bit to an output terminal to generate a first internal address bit responsive to a control signal applied to a control terminal of the selection circuit; and
   a logic circuit receiving a second external address bit, the logic circuit being coupled to the control terminal of the selection circuit, the logic circuit generating the control signal as a function of the second external address bit.

2. The system of claim 1 wherein the first external address bit comprises an external column address bit, and the first internal address bit comprises an internal column address bit.

3. The system of claim 1, further comprising a latch coupled to receive the first and second external address bits, the latch storing the first and second external address bits prior to coupling the first and second external address bits to the selection circuit and the logic circuit, respectively.

4. The system of claim 1 wherein the selection circuit comprises a multiplexer.

5. The system of claim 1, further comprising:
   a counter having a counter output; and
   a multiplexer having a first input coupled to receive the first external address bit, a second input coupled to the inverter circuit to receive the complement of the first external address bit, a third input coupled to the counter output, and at least one multiplexer output coupled to the selection circuit, the multiplexer being operable to couple either the third input to the selection circuit or the first and second inputs to the selection circuit responsive to a second control signal.

6. The system of claim 5 wherein the second control signal is operable to cause the multiplexer to couple the third input to the selection circuit during a first bit of an address burst, and to cause the multiplexer to couple the first and second inputs to the selection circuit during subsequent bits of an address burst.

7. The system of claim 1 wherein the first external address bit is identical to the second external address bit.

8. The system of claim 1 wherein the first address bit is different from the second external address bit.

9. The system of claim 1 wherein the logic circuit is operable to generate the control signal as a function of the first external address bit and the second external address bit.

10. A memory device, comprising:
    at least one array of memory cells arranged in rows and columns, each of the rows having a row line and each of the columns having a pair of complementary digit lines;
    a row address circuit coupled to the address bus for activating a row line corresponding to a row address coupled to the row address circuit through the address bus;
    a column address circuit coupled to the address bus for receiving an external column address and for selecting a column of the memory array corresponding to an internal column address; and
    a burst controller coupled to the address bus and to one of the address circuits, the burst controller comprising:
       an inverter circuit receiving first external address bit am the address bus and generating the complement of the first external address bit;
       a selection circuit coupled to the inverter circuit, the selection circuit receiving the first external address bit and the complement of the first external address bit, the selection circuit coupling one of the first external address bit and the complement of the first external address bit to an output terminal to generate an internal address bit responsive to a control signal applied to a control terminal of the selection circuit; and
       a logic circuit receiving a second external address bit, the logic circuit being coupled to the control terminal of the selection circuit, the logic circuit generating the control signal as a function of the second external address bit.

11. The memory device of claim 10 wherein the first external address bit comprises an external column address bit, and the first internal address bit comprises an internal column address bit.

12. The memory device of claim 10, further comprising a latch coupled to receive the first and second external address bits, the latch at storing the first and second external address bits prior to coupling the first and second external address bits to the selection circuit and the logic circuit, respectively.

13. The memory device of claim 10 wherein the selection circuit comprises a multiplexer.

14. The memory device of claim 10, further comprising:
    a counter having a counter output; and
    a multiplexer having a first input coupled to receive the first external address bit, a second input coupled to the inverter circuit to receive the complement of the first external address bit, a third input coupled to the counter output, and at leas one multiplexer output coupled to the selection circuit, the multiplexer being operable to couple either the third input to the selection circuit or the first and second inputs to the selection circuit responsive to a second control signal.

15. The memory device of claim 14 wherein the second control signal is operable to cause the multiplexer to couple the third input to the selection circuit during a first bit of an address burst, and to cause the multiplexer to couple the first and second inputs to the selection circuit during subsequent bits of an address burst.

16. The memory device of claim 10 wherein the first external address bit is identical to the second external address bit.

17. The memory device of claim 10 wherein the first external address bit is different from the second external address bit.

18. The memory device of claim 10 wherein the logic circuit is operable to generate the control signal as a function of the first external address bit and the second external address bit.

19. A computer system, comprising:
a processor having a processor bus;
an input device coupled to the processor through the processor bus and adapted to allow data to be entered into the computer system;
an output device coupled to the processor through the processor bus adapted to allow data to be output from the computer system; and
a memory device coupled to the processor through the processor bus, the memory device comprising:
at least one array of memory cells arranged in rows and columns, each of the rows having a row line and each of the columns having a pair of complementary digit lines;
a row address circuit coupled to the address bus for activating a row line corresponding to a row address coupled to the row address circuit through the address bus;
a column address circuit coupled to the address bus for receiving an external column address and for selecting a column of the memory array corresponding to an internal column address; and
a burst controller coupled to the address bus and to one of the address circuits, the burst controller comprising:
an inverter circuit receiving first external address bit from the address bus and generating the complement of the first external address bit;
a selection circuit coupled to the inverter circuit, the selection circuit receiving the first external address bit and the complement of the first external address bit, the selection circuit coupling one of the first external address bit and the complement of the first external address bit to an output terminal to generate a first internal address bit responsive to a control signal applied to a control terminal of the selection circuit; and
a logic circuit receiving the external address bit, the logic circuit being coupled to the control terminal of the selection circuit, the logic circuit generating the control signal as a function of a second external address bit.

20. The computer system of claim 19 wherein the first external address bit comprises an external column address bit, and the first internal address bit comprises an internal column address bit.

21. The computer system of claim 19, further comprising a latch coupled to receive the first and second external address bits, the latch storing the first and second external address bits prior to coupling the first and second external address bits to the selection circuit and the logic circuit, respectively.

22. The computer system of claim 19 wherein the selection circuit comprises a multiplexer.

23. The computer system of claim 19, further comprising:
a counter having a counter output; and
a multiplexer having a first input coupled to receive the first external address bit, a second input coupled to the inverter circuit to receive the complement of the first external address bit, a third input coupled to the counter output, and at least one multiplexer output coupled to the selection circuit, the multiplexer being operable to couple either the third input to the selection circuit or the first and second inputs to the selection circuit responsive to a second control signal.

24. The computer system of claim 23 wherein the second control signal is operable to cause the multiplexer to couple the third input to the selection circuit during a first bit of an address burst, and to cause the multiplexer to couple the first and second inputs to the selection circuit during subsequent bits of an address burst.

25. The computer system of claim 19 wherein the first external address bit is identical to the second external address bit.

26. The computer system of claim 19 wherein the first external address bit is different from the second external address bit.

27. The computer system of claim 19 wherein the logic circuit is operable to generate the control signal as a function of the first external address bit and the second external address bit.

28. A method of generating a bit of internal address, the method comprising:
receiving a bit of first external address;
generating a complement of the bit of the first external address;
coupling the bit of the first external address and the complement of the bit of the first external address through a first signal path;
while the first external address bit and the complement of the bit of the first external address are being coupled through the first signal path, examining a second external address bit; and
selecting as an internal address bit either the bit of the first external address or the complement of the bit of the first external address based on the examination.

29. The method of claim 28 wherein the first external address bit comprises an external column address bit, and the first internal address bit comprises an internal column address bit.

30. The method of claim 28 wherein the act of examining the second external address bit comprises examining the second external address bit to determine the relationship between the second external address bit and first the internal column address bit.

31. The method of claim 28, wherein the act of coupling a bit of the first external address and its complement through the first signal path comprises:
providing an incrementally increasing address; and
selecting either a bit of the incrementally increasing address or the first external address and the complement of the first external address for coupling through the first signal path.

32. The method of claim 28 wherein the first external address bit is identical to the second external address bit.

33. The method of claim 28 wherein the first external address bit is different from the second external address bit.

34. The method of claim 28 wherein the act of selecting as an internal address bit either the bit of the first external address or the complement of the bit of the first external address based on the examination of the second external address bit further comprises selecting the internal address bit based on an examination of the first external address bit.

35. A method of generating a bit of an internal address bit, comprising:

processing a first external address bit;

coupling a bit of the first external address and its complement through a first signal path while a second external address bit is being processed; and selecting either the bit of the first external address or its complement as the internal address bit based on the processing of the second external address bit.

36. The method of claim 35 wherein the first internal address bit comprises an internal column address bit, and wherein the first external address bit comprises an external column address bit.

37. The method of claim 35 wherein the act of processing the second external address bit comprises processing the second external address bit to determine the relationship between the first internal address bit and the second external address bit.

38. The method of claim 37 wherein the act of processing the second external address bit to determine the relationship between the first internal address bit and the second external address bit further comprises processing the second external address bit in one manner responsive to operation in one mode and processing the second external address bit in a different manner responsive to operation in a different mode.

39. The method of claim 35 wherein the act of coupling a bit of the first external address and its complement through a first signal path comprises:

receiving and storing the first external address bit;

inverting the stored first external address bit;

coupling the stored first external address bit through the first signal path; and coupling the inverted stored first external address bit through the first signal path.

40. The method of claim 35 wherein the act of coupling a bit of the first external address and its complement through the first signal path comprises:

applying a bit of a counter to a first input of a multiplexer placed in the first signal path, applying a bit of the first external address and its complement to respective second inputs of the multiplexer; and coupling either the first input or the second inputs of the multiplexer through the first signal path.

41. The method of claim 35 wherein the first external address bit is identical to the second external address bit.

42. The method of claim 35 wherein the first external address bit is different from the second external address bit.

43. The method of claim 35 further comprising:

processing the first external address bit; and selecting either the bit of the first external address or its complement as the internal address bit based on the processing of both the first external address bit and processing of the second external address bit.

* * * * *